United States Patent
Van Beek et al.

(10) Patent No.: US 7,709,285 B2
(45) Date of Patent: May 4, 2010

(54) METHOD OF MANUFACTURING A MEMS DEVICE AND MEMS DEVICE

(75) Inventors: Jozef Thomas Martinus Van Beek, Eindhoven (NL); Mathieu Joseph Emmanuel Ulenaers, Eindhoven (NL)

(73) Assignee: EPCOS AG, Munich (DE)

( * ) Notice: Subject to any disclaimer, the term of this patent is extended or adjusted under 35 U.S.C. 154(b) by 63 days.

(21) Appl. No.: 10/578,026

(22) PCT Filed: Oct. 26, 2004

(86) PCT No.: PCT/IB2004/052203
§ 371 (c)(1),
(2), (4) Date: Mar. 13, 2007

(87) PCT Pub. No.: WO2005/043573

PCT Pub. Date: May 12, 2005

(65) Prior Publication Data
US 2007/0222007 A1      Sep. 27, 2007

(30) Foreign Application Priority Data
Oct. 31, 2003    (EP)    ................... 03104045

(51) Int. Cl.
*H01L 21/00* (2006.01)
(52) U.S. Cl. .................... 438/53; 438/48; 257/E31.001
(58) Field of Classification Search ................... 438/48, 438/50, 52, 53; 257/417
See application file for complete search history.

(56) References Cited

U.S. PATENT DOCUMENTS 5,050,838 A * 9/1991 Beatty et al. ................. 251/11
5,949,071 A * 9/1999 Ruffner et al. ........... 250/338.3
6,020,215 A * 2/2000 Yagi et al. .................... 438/52
6,162,367 A   12/2000 Tai et al.

(Continued)

FOREIGN PATENT DOCUMENTS

WO    WO 96/08036    3/1996

(Continued)

OTHER PUBLICATIONS

Fritschi R et al: "A Novel RF MEMS Technological Platform"; IECON-2002 Proceedings of the 28$^{TH}$ Annual Conference of the IEEE Industrial Electronics Society; Sevilla Spain; Nov. 5-8, 2002; Annual Conf. Of IEEE New York; vol. 1 of 4 Conf. 28; Nov. 5, 2002; pp. 3052-3056.

(Continued)

*Primary Examiner*—Ha Tran T Nguyen
*Assistant Examiner*—Karen M Kusumakar
(74) *Attorney, Agent, or Firm*—Slater & Matsil, L.L.P.

(57) ABSTRACT

A method for manufacturing a micro-electromechanical systems (MEMS) device, comprising providing a base layer (10) and a mechanical layer (12) on a substrate (14), providing a sacrificial layer (16) between the base layer (10) and the mechanical layer (12), providing an etch stop layer (18) between the sacrificial layer (16) and the substrate (14), and removing the sacrificial layer (16) by means of dry chemical etching, wherein the dry chemical etching is performed using a fluorine-containing plasma, and the etch stop layer (18) comprises a substantially non-conducting, fluorine chemistry inert material, such as $HfO_2$, $ZrO_2$, $Al_2O_3$ or $TiO_2$.

12 Claims, 5 Drawing Sheets

U.S. PATENT DOCUMENTS

| | | |
|---|---|---|
| 6,580,138 B1 * | 6/2003 | Kubena et al. .............. 257/415 |
| 6,706,548 B2 * | 3/2004 | Liu .............................. 438/52 |
| 6,809,394 B1 * | 10/2004 | Visokay ..................... 257/500 |
| 7,279,369 B2 * | 10/2007 | Lei et al. .................... 438/149 |
| 2001/0005631 A1 * | 6/2001 | Kim et al. ................... 438/689 |
| 2001/0051302 A1 * | 12/2001 | Dove et al. ..................... 430/5 |
| 2002/0031711 A1 * | 3/2002 | Steinberg et al. ............... 430/5 |
| 2002/0117752 A1 * | 8/2002 | Dennison et al. ........... 257/752 |
| 2003/0003641 A1 * | 1/2003 | Cho et al. ................... 438/200 |
| 2003/0059720 A1 * | 3/2003 | Hwang et al. .............. 430/311 |
| 2004/0077119 A1 | 4/2004 | Ikeda et al. |
| 2004/0145056 A1 * | 7/2004 | Gabriel et al. .............. 257/758 |

FOREIGN PATENT DOCUMENTS

| | | |
|---|---|---|
| WO | WO 01/48795 | 7/2001 |
| WO | WO 03/055789 | 7/2003 |
| WO | WO/03078299 | 9/2003 |

OTHER PUBLICATIONS

Chang C et al: "Innovative Micromachined Microwave Switch With Very Low Insertion Loss"; Sensors and Actuators A, Elsevier Sequoia S.A. Lausanne; CH vol. 79 No. 1; Jan. 2000; pp. 71-75.

* cited by examiner

METHOD OF MANUFACTURING A MEMS DEVICE AND MEMS DEVICE

TECHNICAL FIELD

This invention relates to a method of manufacturing an electronic device comprising a micro-electromechanical systems (MEMS) element which comprises a first and a second electrode, which second electrode is movable towards and from the first electrode, which method comprises the steps of:

providing a base layer of an electrically conductive material at a first side of a substrate, in which base layer the first electrode and a contact pad are defined;

providing a sacrificial layer, which at least covers the first electrode in the base layer, but leaves the contact pad at least partially exposed;

providing a mechanical layer of an electrically conductive material on top of the sacrificial layer, said mechanical layer being mechanically connected to the contact pad in the base layer, and removing said sacrificial layer by means of dry chemical etching.

The invention also relates to an electronic device comprising a micro-electromechanical systems (MEMS) element at a first side of a substrate, which MEMS element comprises a first and a second electrode, that is movable towards and from the first electrode between a closed and an opened position, and that is separated from the first electrode by an air gap in its opened position.

BACKGROUND

Microelectromechanical systems (MEMS) refer to a collection of micro-sensors and actuators, which can react to an environmental change under micro-circuit control. The integration of MEMS into traditional radio frequency (RF) circuits has resulted in systems with superior performance levels and lower manufacturing costs. The incorporation of MEMS based fabrication technologies into micro and millimeter wave systems offers viable routes to devices with MEMS actuators, antennas, switches and capacitors. The resultant systems operate with an increased bandwidth and increased radiation efficiency, reduced power consumption, and have considerable scope for implementation within the expanding area of wireless personal communication devices.

MEMS elements comprise a first and a second electrode of which the second electrode is movable to and from the first electrode between an opened position and a closed position, in which opened position there is an airgap between the first and the second electrode. A dielectric layer may be present on top of the first electrode. This leads to the fact that the first electrode does not make electrical contact with the second electrode in its closed position, but forms a capacitor therewith. The other electrode or electrodes may also be provided with dielectric layers or native oxides if so desired.

The fact that the second electrode must be movable, but still be incorporated in a mechanically stable construction results in the fact that the devices are usually provided with a mechanical layer of sufficient thickness and mechanical stability. The second, movable electrode may be provided in the mechanical layer, but this is not necessary. It may also be provided in an additional intermediate layer between the beam and the first electrode. In particular, recent experiments have shown that it is advantageous to fabricate a MEMS element with a third electrode in the mechanical layer, in addition to the second electrode that is present in an intermediate electrode layer. The second electrode is then movable not only towards the first electrode, but also towards the third electrode.

Surface micro-machining is a common method for the fabrication of MEMS, and the processing sequence used in surface micro-machining is illustrated schematically in FIG. 1 of the drawings. A base layer 10, a sacrificial layer 16 and a beam or mechanical layer 12 are deposited on a substrate 14 and structured. The beam layer 12 is made free-standing by etching the sacrificial layer 16. This means that the beam layer has a larger area that is not supported by a substrate. The beam layer is then supported through supports to one or more contact pads in the base layer. This support may be present under the beam layer, but also more or less laterally to the beam layer. The latter alternative is particularly present if the beam layer has a bridge-like or membrane-like construction, and provides a better elasticity for vertical movement to the beam layer. The beam layer may be electrically conducting as in this case, in which the contact pads are also electrical contact pads. However, this is not necessary. In this embodiment, the second electrode is defined in the mechanical layer 12, and the first electrode is defined in the base layer.

The critical processing step in the above-mentioned sequence is the etching of the sacrificial layer, and the etchant for etching this layer should ideally fulfill several criteria:

it should not etch the beam and base layers;

it should not lead to sticking of the second electrode to the substrate after etching; and it should result in the fact that the second electrode is movable between its ultimate position without any mechanical resistance from parts of the sacrificial layer that are not removed.

Several MEMS systems of materials with their sacrificial layer etchant are known. The most common system is the wet-chemical etching of a $SiO_2$ sacrificial layer in a solution of HF using beam and base layers (12, 10) consisting of Si. However, the main disadvantage of the known system is that the free-standing layer 12 tends to stick to the base layer as a result of capillary forces during drying of the substrate after HF etching. Another type of system, which does not have this drawback is one in which the etchant consists of a gas or plasma rather than a liquid. This type of system is known as dry chemical etching. A known system of this type uses an $O_2$ plasma for sacrificial layer etching. In this case, the sacrificial layer consists of a polymer and the base layer and mechanical layers comprise a metal. The substrate, and any dielectric layers on the substrate or on the base layer can be exposed additionally.

However, a drawback of this system is the fact that the polymer sacrificial layer limits the processing freedom of the beam layer. The processing temperature of the beam layer is then limited, since polymers tend to flow and/or outgas at high temperatures (200-300° C.). This considerably restricts the choice of material for the mechanical layer. Furthermore, the use of polymers for structural layers is non-standard in common IC processes.

The restriction is particularly problematic if the sacrificial layers must be removed only locally. Suitably, the mechanical layer is also used as interconnects, and possibly other elements such as inductors and capacitors are present in the device. They are laterally displaced from the MEMS element, but defined in the same layers. The mechanical layer has therein a function of interconnect layer, and the interconnects or coils that have a size in the order of micrometers or even millimeters ought not to hang in the air without sufficient support. In order to remove the sacrificial layer only locally, parts thereon must be protected by a protective layer, such as a photoresist. A photoresist, is however, a polymer layer and the etchant that removes a polymer sacrificial layer tends to remove the polymer layer as well.

SUMMARY

It is therefor an object of the invention to provide a method of the kind mentioned in the opening paragraph, in which the sacrificial layer can be removed only locally.

This object is achieved in that an etch stop layer of electrically insulating and fluorine chemistry inert material is provided at a first side of a substrate between the substrate and the base layer, and the dry chemical etching is performed using a fluorine-containing plasma.

The fluorine chemistry allows the removal of sacrificial layer while any photoresist with windows giving access to the sacrificial layer protects other areas of the sacrificial layer. Furthermore, the fluorine chemistry has the advantage that it removes certain materials isotropically; hence, the recess between the beam layer and the substrate can be adequately removed, such that the beam layer becomes free. A disadvantage of the fluorine type of chemistry is however that it tends to be too reactive and removes other layes than the sacrificial layer. In particular, it was found to be a problem that due to the etching of an oxidic layer at the surface, electrodes in the base layer get underetched, and hence do not function adequately anymore. This disadvantage is overcome in that an etch stop layer is used.

It is an advantage of the invention that the support of the mechanical layer on the substrate is improved. In fact, the support hereof is not only the vertical interconnect of the mechanical layer to the base layer. It is also the part of the sacrificial layer that has not been removed. In fact, the gap between the mechanical layer and the base layer in the recess may well be a cavity.

It is another advantage hereof, that the non-removed part of the sacrificial layer acts as well as a chemical protection layer for the MEMS element.

It is a further advantage of the dry-etching process that any sticking of the second movable electrode to the first electrode is diminished substantially in comparison to any wet-chemical etching process.

It is understood that the mechanical layer generally includes a beam-like, free-standing structure. The beam layer may be carrier by a support on one side, two sides (thus having a bridge-like structure) or many sides (thus having a membrane-like structure). The beam layer may include the second electrode, but this is not necessary. It appears particularly suitable to define the second electrode in an intermediate metal layer, in which the beam layer acts either as interconnect to this second electrode, or as a third electrode, or perhaps as both.

In a preferred embodiment, the sacrificial layer comprises inorganic material. This is relevant for the packaging of the elements. RF MEMS elements need to be packaged hermetically, so as to prevent any disturbing influences on the beam movements. This hermetic packaging is usually done with the use of a ring of solder or any other metal, which is adequately connected in a reflow oven. The temperature used in such a reflow process is detrimental to many of the polymer sacrificial layers. The provision of the packaging may be done directly after processing; however, it might well be done in a separate assembly factory, operated by another company.

In a further embodiment, the device further comprises a thin-film capacitor, having a first and a second electrode and an intermediate dielectric, wherein the first electrode is defined in the base layer and the sacrificial layer acts as dielectric. As will be clear, it is in this case very important for the sacrificial layer to be removed only locally. It is furthermore very important for the sacrificial layer to be stable enough to withstand any temperature steps used during further processing, and particularly during packaging. Also, the sacrificial layer must be chosen to have adequate dielectric properties. Suitable materials herefor include for instance silicon nitride, particularly as deposited with PECVD, silicon oxide, tantalumoxide.

In another preferred embodiment, the etch stop layer is located between the first electrode and the substrate. This has a number advantages: first of all, the etch stop layer does not need to be structured in order to allow vertical interconnects and the use of the MEMS element as a switch. Secondly, it allows to use materials for the etch stop layer that need a higher deposition or curing temperature than the bottom electrode allows. Third, any dielectric properties of the etch stop layer do not influence any capacitor characteristics. For the sake of completeness it is observed that the etch stop layer might be patterned, particularly in case any elements in the substrate are present.

In a specific embodiment, the fluorine containing plasma is a $CF_4$ plasma, and the etch stop layer preferably comprises a Group $IV_n$-oxide. Such Group $IV_n$-oxides include $HfO_2$, $ZrO_2$, and particularly $Al_2O_3$ and $TiO_2$. Alternative materials include for instance TiN, AlN and diamond. Further etch stop layers, such as even certain perowskite materials, are not excluded.

The $CF_4$-plasma is advantageous in comparison to other fluorine plasmas such as $CHF_3$ and $CH_2F_2$ in that it has a very isotropic behavior. Therewith, it allows removal of the sacrificial layer over a large area in lateral dimensions. Hence, the beam layer can be large. Known additions to the plasma, such as mixture with oxygen to get oxidizing behaviour, or dilutions with argon or nitrogen, are possible as well. Other fluorine plasmas are certainly not excluded, however. Particularly if oxynitrides or even oxides are used for the sacrificial layer instead of nitrides, the use of $CF_2H_2$ or $CHF_3$ is preferred. In order to speed up the etching in lateral directions, the beam and the photoresist may be provided with a larger number of windows to give access to the sacrificial layer. Furthermore, the power and time of dry etching can be tuned to get the desired result of local etching of the sacrificial layer. It is furthermore possible that the etching is done in more than one step, the first step being used for creating an etching surface on the sacrificial layer that is sufficiently large. Combinations of dry and wet etching could be used thereto. Other fluorine plasmas such as $SF_8$ can be used alternatively.

In a further embodiment, the method of the invention comprises the further steps of:

providing an intermediate layer of an electrically conductive material on the sacrificial layer, in which intermediate layer the second electrode of the MEMS-element is defined; and providing a second sacrificial layer, which covers the second electrode at least partially and is provided with a window that leaves the contact pad exposed, said second sacrificial layer being removed in the same step as the—first—sacrificial layer.

These further steps result in a device with at least three electrically conductive layers. Such a device turns out to have beneficial properties, both for the MEMS-element and for any optionally present thin-film capacitor. It allows more advanced designs of the MEMS-element. Examples hereof are a bi-stable MEMS switch, a tri-electrode MEMS capacitor with extending and possibly continuous range, a low actuation voltage switch, an anti-stiction dimple switchable capacitor, and a tunable capacitor with infinite dynamic range.

The base layer and the mechanical layer preferably comprise a metallic or metal oxide material. Suitable materials for the base layer include aluminum, copper, nickel, silver, gold, suitable alloys of these metals, platinum, ruthenium oxide, indium tin oxide and others. Suitable materials for the mechanical layer include aluminum, copper, nickel and alloys thereof in particular.

The invention further relates to an electronic device with a micro-electromechanical systems (MEMS) element of the kind mentioned in the opening paragraph, wherein an etch stop layer is present between the first electrode and the substrate, the etch stop layer comprising a substantially non-conducting, fluorine chemistry inert material. This device is the result of the method. It is advantageous in that with this device the sticking problems of the device encountered in the prior art due to the wet-chemical etching are prevented. Moreover, the device allows advanced designs of MEMS elements and a suitable integration of the MEMS element with other passive elements and interconnects. This is particularly possible in that the sacrificial layer needed so as to define a movable second electrode can be used for alternative purposes. Particularly, it is an inorganic material that is stable at any temperatures of reflowing solder. It thus may be maintained, while the device is provided with a suitable package for encapsulation of the MEMS element, and optionally other elements.

In a very suitable embodiment, the movable second electrode is mechanically connected to the substrate through a support structure, at which support structure, at a first lateral side face of this support structure, that is, the air gap of the MEMS element is present, while at a second lateral side face opposite to the first side face, an insulating material is present. Furthermore, the second electrode is connected to or is part of a mechanical layer that extends laterally beyond the MEMS element on top of the insulating material.

In a further embodiment, the device further comprises a thin-film capacitor with a first and a second electrode and an intermediate dielectric, said first and second electrodes being defined in a first and a second layer respectively, in which also the first and the second electrode of the MEMS element are defined. One of the advantages of MEMS elements, compared to pin diodes or pHEMT transistors, is the possibility of integration with other elements. In case of a MEMS variable capacitor, thin film capacitors are needed in order to provide the basis capacity level that can be further tuned with the MEMS capacitors. In case of switches, it is suitable to couple inductors to the MEMS switches. Such switches allow any change of inductance. Even in the case of simple switching, capacitors are generally needed for a variety of purposes. This embodiment provides a very cost-effective combination of a MEMS-element and a thin-film capacitor that can be designed as one complete system and in which a minimal number of conductive layers is needed.

In another further embodiment, an inductor is defined in the mechanical layer. In again another embodiment, an intermediate layer of an electrically conductive material is present, in which intermediate layer the second electrode of the MEMS-element is defined. Such a device turns out to have beneficial properties, both for the MEMS-element and for any optionally present thin-film capacitor. It allows more advanced designs of the MEMS-element. Examples hereof are a bi-stable MEMS switch, a tri-electrode MEMS capacitor with extending and possibly continuous range, a low actuation voltage switch, an anti-stiction dimple switchable capacitor, and a tunable capacitor with infinite dynamic range. Generally, the intermediate layer is connected herein to the mechanical layer, which therewith provides the mechanical stability and the possibility of controlled movements towards and from the first electrode. The various devices will be further explained with reference to the drawings. Any materials and embodiments referred to with respect to the method are also applicable to the device of the invention.

These and other aspects of the present invention will be apparent from, and elucidated with reference to, the embodiment described hereinafter.

BRIEF DESCRIPTION OF DRAWINGS

An embodiment of the present invention will now be described by way of example only and with reference to the accompanying drawings, in which.

The Figures are only diagrammatical and equal reference numbers will be used in different figures to refer to equal or similar parts.

DETAILED DESCRIPTION

Figure 1:
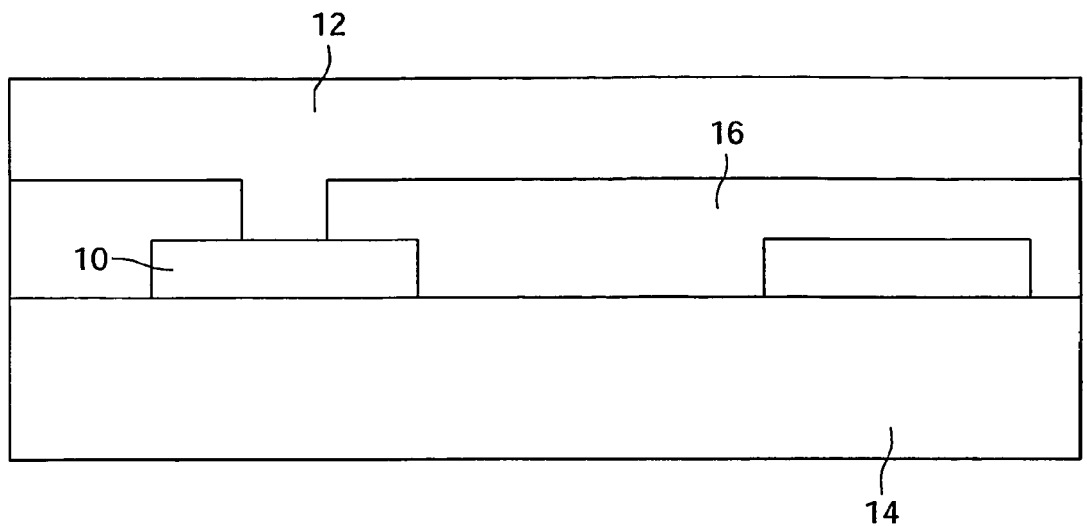
FIG. 1 is a schematic illustration of the general surface micro-machining process flow for the fabrication of MEMS, in accordance with the prior art.
Figure 1:
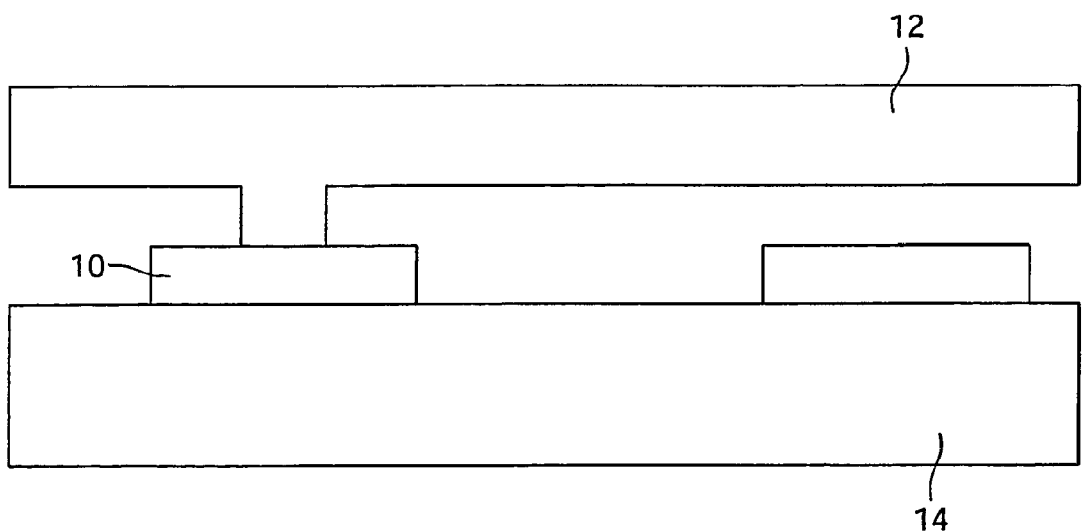

In MEMS fabrication, surface micro-machining is often used for making free-standing structures on top of, for example, silicon substrates. The general process flow for surface micro-machining is illustrated in FIG. 1 of the drawings. As shown, a base layer 10 and a mechanical layer 12, of Al, Cu, Ni or an alloy thereof are deposited on a substrate 14 with a sacrificial layer 16 between them. The sacrificial layer 16 is then removed by means of etching leaving the base layer 10 in the form of free-standing, freely moveable structures.

The sacrificial layer 16 is preferably etched by means of dry-etching in order to prevent the mechanical layer 12 from sticking to the substrate 14. Sticking can occur as a result of capillary force during drying of a wet etched sacrificial layer.

Dry-etching is well established in IC manufacturing. The most common form of dry etching for micro-machining applications is reactive ion etching (RIE). Ions are accelerated towards the material to be etched, and the etching reaction is enhanced in the direction of travel of the ion. RIE is an anisotropic etching technique. A known form of RIE is a plasma etch method. A plasma can be defined as a partially ionised gas made up of equal numbers of positively and negatively charged particles, together with a different number of uncharged particles, and when employing a plasma etch system, a combination of chemical reaction with physical bombardment at high energy (sputtering) is used to remove the sacrificial layer. However, dry-etching technology relies heavily on fluorine chemistry.

For example, International Patent Application Number WO01/48795 describes a fluorine-based plasma etch method for anisotropic etching of high open area silicon structures. In the method described, first, a substrate on which the base layer and the mechanical layer are deposited with a sacrificial layer between them is loaded into a plasma etch chamber. Next, a gas mixture is provided in the plasma etch chamber, which gas mixture includes an oxygen source gas, a fluorine source gas and a fluorocarbon source gas. In the method described, a preferred oxygen source gas is $O_2$. Fluorine acts as the primary etchant and can be provided from any number of multi-fluorine atom compounds such as, for example, $CF_4$, $NF_3$ and $SF_6$. The next step is to form a plasma from the gas mixture by, for example, applying RF energy thereto. The pressure within the chamber is then regulated and the required portion of the substrate assembly is etched with the plasma.

However, when using fluorine dry etching chemistry for etching sacrificial layers during MEMS fabrication, special care needs to be taken to avoid etching of the substrate itself, which in most cases will be a silicon wafer. We have now devised an improved method.

Figure 2:
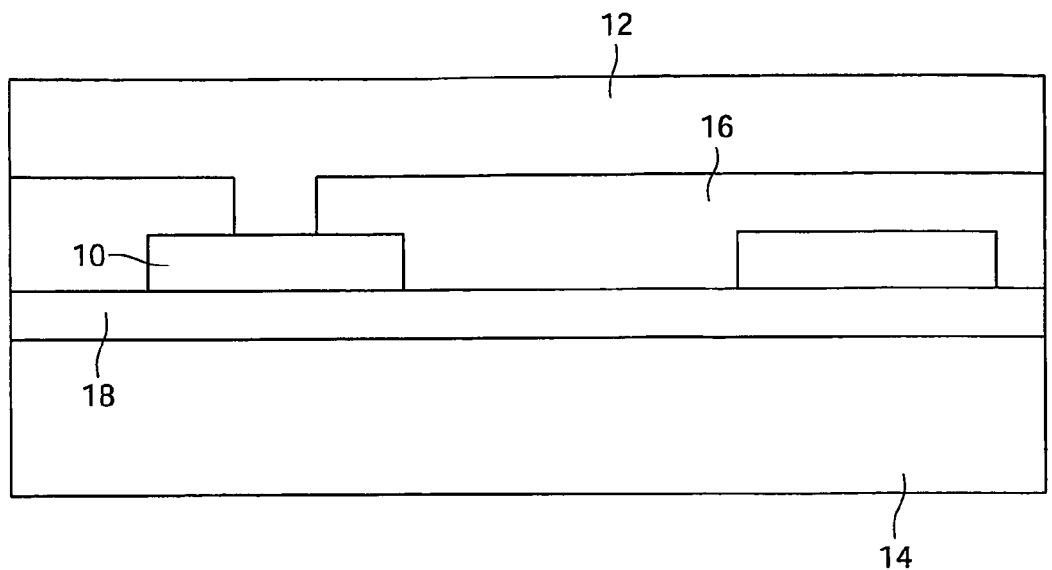
FIG. 2 is a schematic illustration of a general surface micro-machining process flow for the fabrication of MEMS, in accordance with an exemplary embodiment of the present invention.
Figure 2:
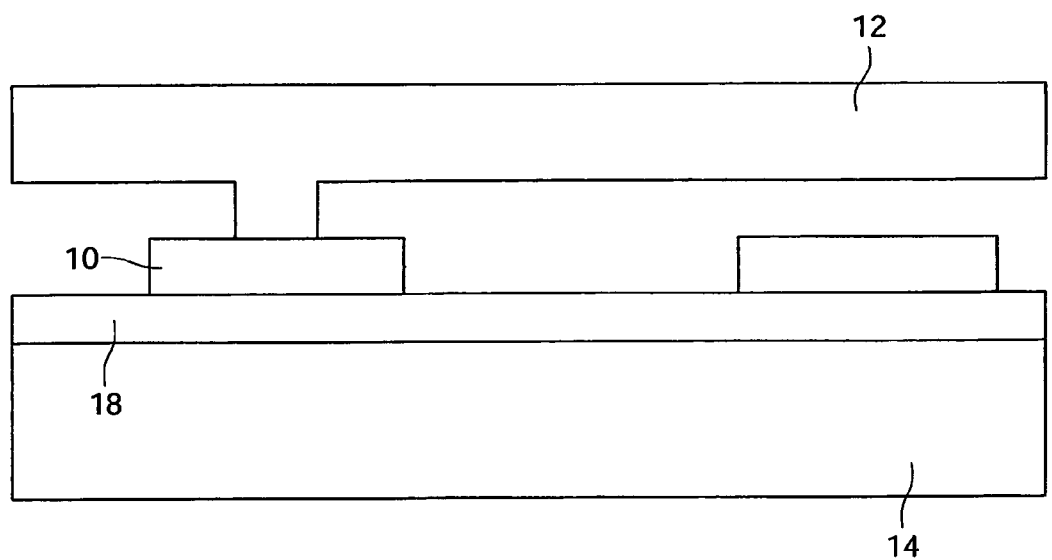

Referring to FIG. 2 of the drawings, in accordance with the invention, there is provided a non-conducting, fluorine chemistry inert, etch-stop layer 18 between the MEMS layer stack (consisting of the base layer 10 and the mechanical layer 12) and the (usually silicon) substrate 14 so as to avoid etching of the Si wafer during sacrificial layer etching, preferably using $CF_y$ plasma etching. The substrate 14 advantageously comprises an amorphous top layer and thereon a thermal oxide. The etch-stop layer 18 preferably comprises any one of the Group IV-oxides, such as $Al_2O_3$, $HfO_2$, $ZrO_2$ and $TiO_2$. In one preferred embodiment, the etch-stop layer 18 may comprise $Al_2O_3$ of a thickness of for instance 100 nm. A wide variety of material systems can be used when the etch-stop layer 18 is in place. The sacrificial layer 16 may, for example, consist of Si, $Si_3N_4$, $SiO_2$, W, Mo. The mechanical layer 12 and the base layer 10 consist of conductors, such as Al, Ni, Au, Cu or Pt. In this embodiment, aluminum conductors have been used for the base layer, and an alloy of $Al_{0.98}Cu_{0.02}$ has been used for the mechanical layer.

Figure 3:
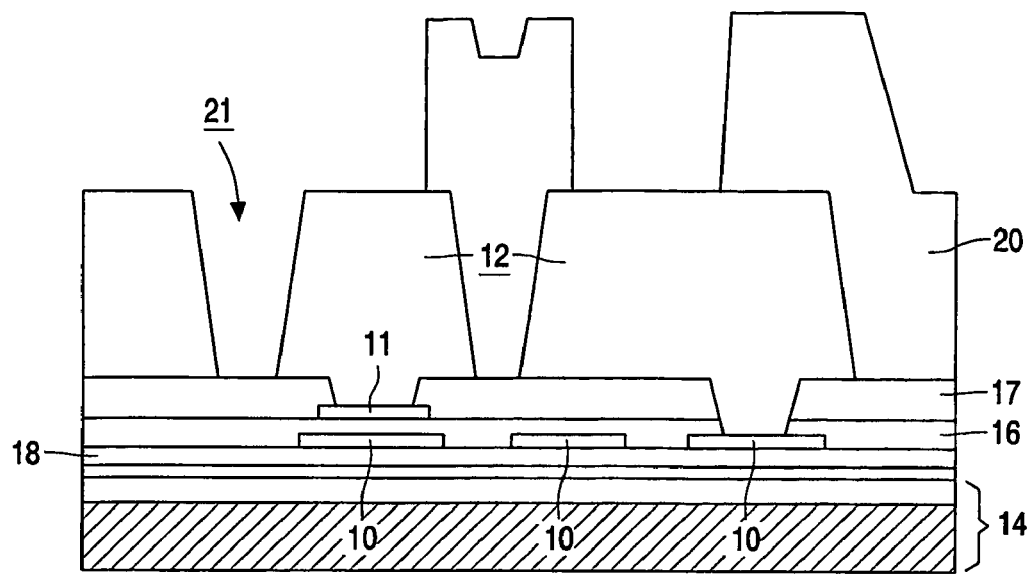
FIG. 3 shows diagrammatically and in cross-sectional view a stage in the manufacturing of the electronic device of the invention.

Referring to FIG. 3 a stage in the manufacturing of the device of the invention is shown. In this stage the etch-stop layer 18, the base layer 10, the sacrificial layer 16 and the mechanical layer 12 have been applied. In addition, as compared to the embodiment of FIG. 2, there is an intermediate metal layer 11, and a second sacrificial layer 17. Windows in the sacrificial layers 16 and 17 have been made only after the provision of this second sacrificial layer. This is effected with reactive ion etching. The metal layers 10,11 have acted as etch-stop layers, that at one stage the mechanical layer 12 is connected to the intermediate metal layer 11, whereas at another stage it is connected to the base layer 10. A mask 20 is applied on top of the mechanical layer 12. This mask 20 includes a window 21 to the sacrificial layer 17. Use is made of a polyimide with a thickness of about 5 μm. This is suitable in view of the thickness of the mechanical layer 12, for instance 1 μm, and offers sufficient protection against the fluorine plasma. Hereafter, the sacrificial layers 16,17 are locally etched, so as to create an air gap. The mask 20 is not removed but constitutes part of the beam structure of the MEMS element. In addition, it may act as a passivation layer for other elements in the device. The mask 20 may further be used to provide further metal layers according to a desired pattern that can be used as contact pads, and as sealing ring for an hermetic package. Use is made herein of electroplating.

FIGS. 4, 5, 6 and 7 show in cross-sectional view advantageous embodiments of the device of the invention with different MEMS designs. It is a first advantage of the process that the local removal allows a better mechanical stability, and thus more complex designs of the MEMS elements. It is a further advantage of the process of the invention, that all these different designs can be implemented in one and the same device. This allows to use a MEMS element of one specific design for one function and to use a MEMS element of another design for another function. For instance, whereas the isolation is very important in antenna switches used for the receive band of a mobile phone, the actuation voltage and capacity range are more important parameters for variable capacitors. For sensor applications, the sensitivity is again the most important parameter, and for other switch applications the switching speed is crucial.

Figure 4:
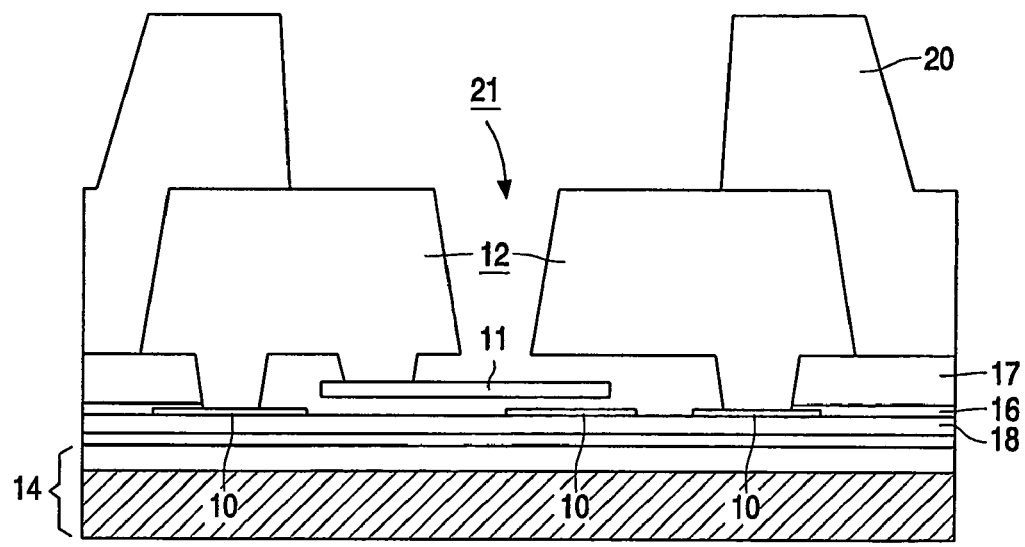
FIGS. 4, 5, 6 and 7 show in cross-sectional view and schematically several embodiments of the device with specific designs of the MEMS element.

FIG. 4 shows a bistable switch. The bistable switch has proper insulation. In view of the local removal of the sacrificial layers the design is mechanically robust. Furthermore, it allows a good power handling and it is fast.

Figure 5:
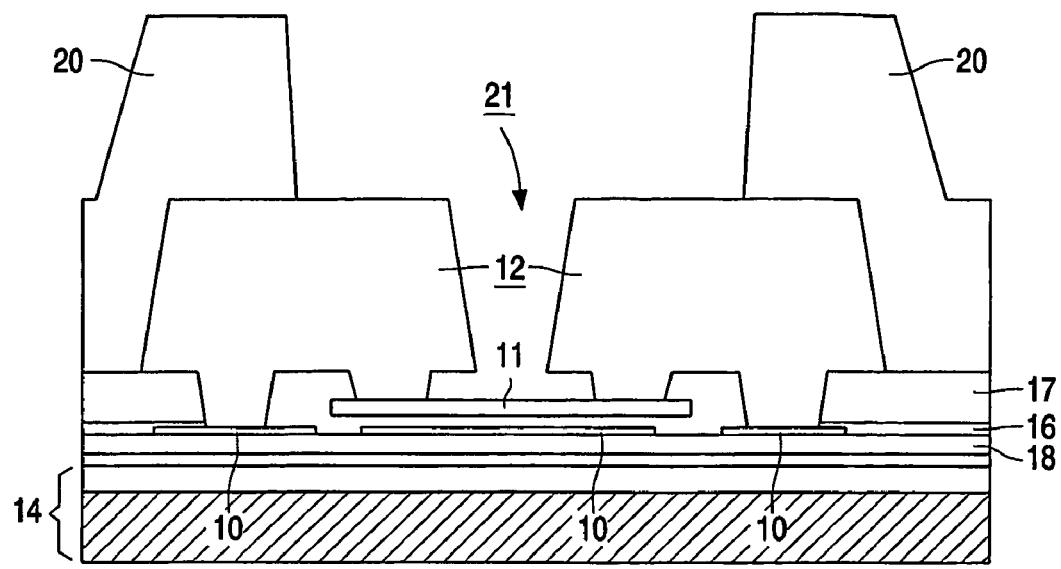

FIG. 5 shows a low actuation voltage switch. Although the insulation is reduced, the gap between the different states is smaller than in conventional switches. This allows the use of a low actuation voltage. In a derived embodiment for a capacitor, this construction has the advantage that the capacitive area can be very large.

Figure 6:
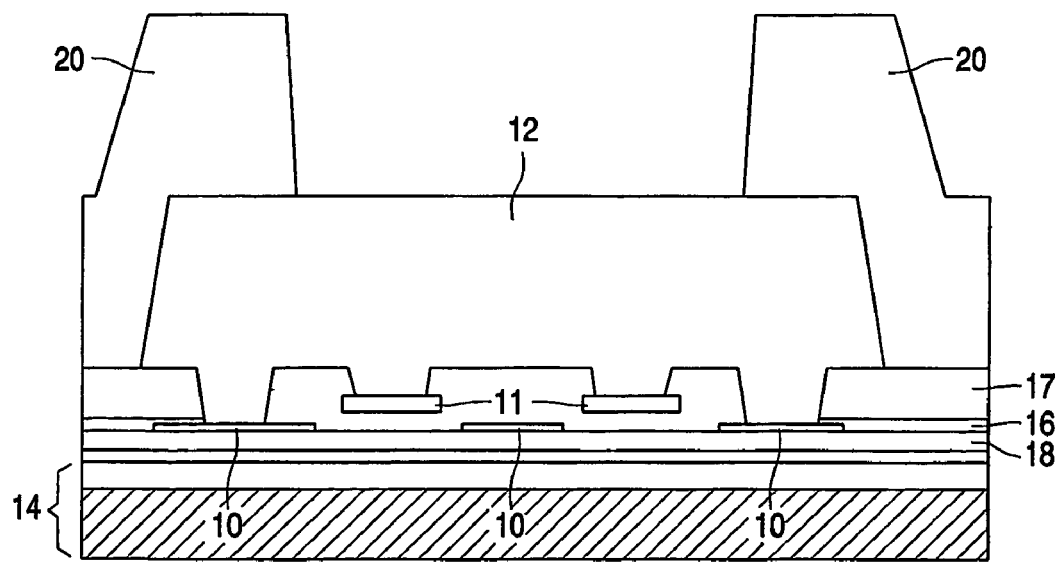

FIG. 6 shows a anti-stiction dimple switchable capacitor. Herein, the structures in the intermediate metal layer 11 are anti-stiction dimples, which are not part of the electrodes. On bringing the mechanical layer 12 closer to the base layer 10, a minimal distance is reached when the anti-stiction dimples get into contact with the etch stop layer.

Figure 7:
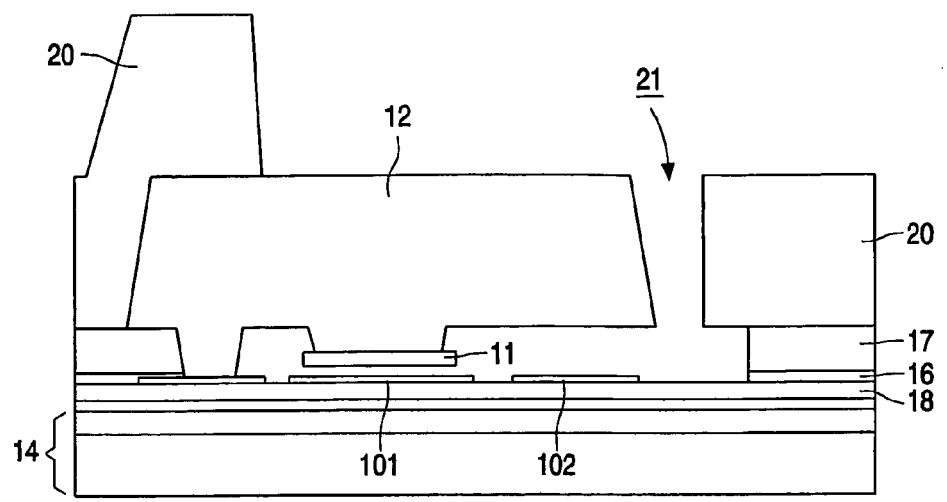

FIG. 7 shows a tunable capacitor with infinite range. The base layer comprises herein a first electrode 101 and a second electrode 102. The second electrode 102 can be used for provision of the actuation voltage, so as to separate this actuation voltage provision for the actual signal. This allows that the first electrode 101 can come into contact with the mechanical layer 12, and hence provide an infinite dynamic range.

Figure 8:
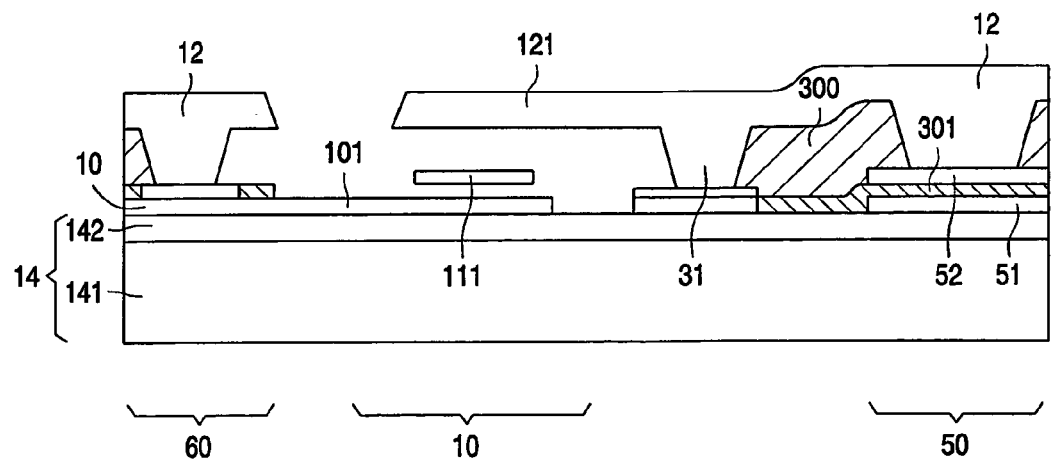
FIG. 8 shows a cross-sectional diagrammatical view of a further embodiment of the device of the invention.

FIG. 8 shows a cross-sectional diagrammatical view of a further embodiment of the device comprises both a MEMS element and a thin film capacitor 50, as well as a vertical interconnect 60. This figure illustrates the advantageous feature of the invention, that the MEMS element having electrodes 101, 111, 121 in the base layer 10, the intermediate layer 11 and the mechanical layer 12 can be embedded in a passive network that comprises other components as well, and without the need to apply any additional metal layer, or sacrificial layer. In fact, the first sacrificial layer 16 functions also as dielectric 301 of the thin-film capacitor 50. The electrodes 51,52 of the thin-film capacitor 50 are defined in the same metal layers as the second and the third electrode of the MEMS element 10. The third metal layer 12 is not only first electrode 121, but also interconnect. It is herein of particular importance for the first and second sacrificial layers 16,17 to be selectively etched away. The improvement is that not just one aperture in the mechanical layer 12 is present, but a plurality of apertures are, and that the supporting structure 300 has a substantial extension, i.e. it is primarily wall-shaped and not pillar-shaped.

It should be noted that the above-mentioned embodiment illustrates rather than limits the invention, and that those skilled in the art will be capable of designing many alternative embodiments without departing from the scope of the invention as defined by the appended claims. In the claims, any reference signs placed in parentheses shall not be: construed as limiting the claims. The words "comprising" and "comprises", and the like, do not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of manufacturing an electronic device comprising a micro-electromechanical systems (MEMS) element, which MEMS element comprises a first and a second electrode, which second electrode is movable towards and from the first electrode, which method comprises the steps of:
providing an etch stop layer of electrically insulating material at a first side of a substrate, the substrate being etchable by dry etching using fluorine chemistry;
providing a base layer of an electrically conductive material on the etch stop layer at the first side of the substrate, the first electrode being defined in the base layer;
providing a sacrificial layer which at least covers the first electrode in the base layer;
providing a mechanical layer of an electrically conductive material on top of the sacrificial layer, said mechanical layer being mechanically connected to the substrate;
providing the second electrode by defining same in the mechanical layer or as a separate layer in or on the sacrificial layer;
providing a mask on top of the mechanical layer, the mask including at least one window to the sacrificial layer; and
removing selective areas of said sacrificial layer by means of dry chemical etching, such that the second electrode is made movable towards and from the first electrode, wherein said dry chemical etching is performed using a fluorine-containing plasma, and the etch stop layer comprises a substantially non-conducting, fluorine chemistry inert material.

2. A method as claimed in claim 1, wherein the sacrificial layer comprises inorganic material.

3. A method as claimed in claim 2, further comprising forming a thin-film capacitor on the substrate, the thin-film capacitor having a first and a second capacitor electrode and an intermediate dielectric, wherein the first capacitor electrode is defined in the base layer parallel to defining the first electrode of the MEMS element and wherein the intermediate dielectric is defined in the sacrificial layer and the second capacitor electrode is defined in the same layer as the second electrode of the MEMS element, the part of the sacrificial layer defining said intermediate dielectric not being removed by said dry chemical etching.

4. A method as claimed in claim 1, wherein the etch stop layer is provided at the first side of the substrate before provision of the base layer.

5. A method as claimed in claim 1, wherein said fluorine-containing plasma is a $CF_y$ plasma.

6. A method as claimed in claim 1, further comprising the steps of:
providing an intermediate layer of an electrically conductive material on the sacrificial layer, the second electrode being defined in the intermediate layer; and
providing a second sacrificial layer which covers the second electrode at least partially, said second sacrificial layer being removed in the same step as the sacrificial layer.

7. A method as claimed in claim 6, wherein the base layer is provided with a contact pad, at least one window in the sacrificial layer and the second sacrificial layer leaving the contact pad exposed until filling of the window during provision of the mechanical layer and wherein the window in the sacrificial layer is provided after deposition of the second sacrificial layer.

8. A method as claimed in claim 1, wherein said etch stop layer comprises a Group IV n-oxide.

9. A method as claimed in claim 8, wherein said etch stop layer comprises $HfO_2$, $ZrO_2$, $Al_2O_3$ or $TiO_2$.

10. A method as claimed in claim 1, wherein the substrate is a silicon substrate.

11. A method as claimed in claim 1, wherein the etch stop layer comprises a material selected from an oxide of a group IV material, TiN, AlN, diamond and a perovskite material.

12. A method as claimed in claim 11, wherein the etch stop layer comprises $Al_2O_3$.

* * * * *